United States Patent
Lo

(10) Patent No.: US 6,304,452 B1
(45) Date of Patent: Oct. 16, 2001

(54) CLIP FOR SECURING HEAT SINK TO ELECTRONIC DEVICE PACKAGE

(75) Inventor: Wei-Ta Lo, Miou-Li (TW)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/670,059

(22) Filed: Sep. 25, 2000

(30) Foreign Application Priority Data

May 25, 2000 (TW) .............................................. 089208925

(51) Int. Cl.[7] .................................................. H05K 7/20
(52) U.S. Cl. ...................... 361/704; 361/707; 361/717; 361/718; 361/719; 257/718; 257/719; 165/80.2; 411/508; 411/509
(58) Field of Search ................................... 361/704–712, 361/717–722; 257/706, 718, 719, 727; 165/80.2, 80.3; 24/453, 297; 174/16.3; 411/508, 509

(56) References Cited

U.S. PATENT DOCUMENTS

| | | | |
|---|---|---|---|
| 5,384,940 * | 1/1995 | Soule et al. ........................... | 361/719 |
| 5,730,210 * | 3/1998 | Kou ...................................... | 165/80.3 |
| 5,870,286 * | 2/1999 | Butterbaugh et al. ............... | 361/704 |
| 6,104,614 * | 8/2000 | Chou et al. .......................... | 361/704 |
| 6,212,074 * | 4/2001 | Gonsalves et al. .................. | 361/717 |

\* cited by examiner

*Primary Examiner*—Gerald Tolin
*Assistant Examiner*—Boris L. Chervinsky
(74) *Attorney, Agent, or Firm*—Wei Te Chung

(57) ABSTRACT

A clip includes a pin (40) and a leaf spring (50). The pin includes a columnar body (44), an expanded head (42) formed at a top end of the body, and a cone-shaped plug (48) formed at a bottom end of the body opposite the head. A slot (488) is defined through the plug and a bottom portion of the body, to enable the plug to elastically deform. The plug is thus adapted for extending through a heat sink and engaging with a printed circuit board. A flange (46) extends perpendicularly from the body between the head and the plug. The leaf spring includes a base (51), with an opening (52) defined therein for extension of the pin therethrough. A pair of inflexed prolongations (53) extends progressively downwards from opposite corners of the base, with the width of each prolongation being less than half the width of the base.

9 Claims, 4 Drawing Sheets

CLIP FOR SECURING HEAT SINK TO ELECTRONIC DEVICE PACKAGE

BACKGROUND

1. Field of the Invention

The present invention relates to a device for securing a heat sink to an electronic device package, and particularly to a clip that secures a heat sink to an electronic device package.

2. The Related Art

A heat sink for dissipating heat generated by an electronic device package is usually mounted in contact with the package, whereby it conducts the heat away from the package and dissipates the heat by radiation and convection. Various means have been used for putting heat sinks in intimate thermal contact with electronic device packages. For instance, a heat sink may be attached to an electronic device package by an adhesive. However, a heat sink attached in this manner often peels away from the package during transportation, resulting in failure of the assembly. Furthermore, it is extremely difficult to remove such a heat sink from the electronic device package.

To solve the above problem, clips are used to attach a heat sink to an electronic device package. For example, referring to FIGS. 5 and 6, a conventional clip device is composed of a plurality of fasteners 1. Each fastener 1 has a body 14 for being securely received in a slot 22 defined in a heat sink 2, and a latch 16 extending from the body 14. In assembly, the body 14 of each fastener 1 is respectively received in the corresponding slot 22 of the heat sink 2. The latch 16 of the fastener 1 elastically engages with a corresponding bottom edge of an electronic device package 3. Thus the heat sink 2 is attached to the electronic device package 3 by the clip. However, this conventional clip device limits horizontal displacement of the heat sink 2 merely by means of limited friction between the surfaces of the various movable parts. Thus the heat sink 2 easily slides off in a horizontal direction. In addition, the clip device is easily damaged due to over distortion during assembling of the heat sink 2 to the package 3 or during disassembling thereof.

Therefore, an improved means of securing a heat sink to an electronic device package is desired, to overcome the disadvantages of the prior art.

SUMMARY OF THE INVENTION

Accordingly, an object of the present invention is to provide a clip that readily attaches a heat sink to an electronic device package, and is readily detached therefrom.

Another object of the present invention is to provide a clip which securely attaches a heat sink to an electronic device package.

To achieve the above-mentioned objects, a clip in accordance with the present invention comprises a pin and a leaf spring. The pin includes a columnar body, an expanded head formed at a top end of the body, and a cone-shaped plug formed at a bottom end of the body opposite the head. A slot is defined through the plug and a bottom portion of the body to enable the plug to elastically deform. The plug is thus adapted for extending through the heat sink and engaging with a printed circuit board. A flange extends perpendicularly from the body between the head and the plug. The leaf spring includes a base, with an opening defined therein for extension of the pin therethrough. A pair of inflexed prolongations extends progressively downwards from opposite corners of the base. The width of each prolongation is less than half that of the base from which it extends.

Other objects, advantages and novel features of the present invention will be apparent from the following detailed description of preferred embodiments of the present invention with reference to the attached drawings, in which:

DESCRIPTION OF THE PREFERRED EMBODIMENTS

Figure 1:
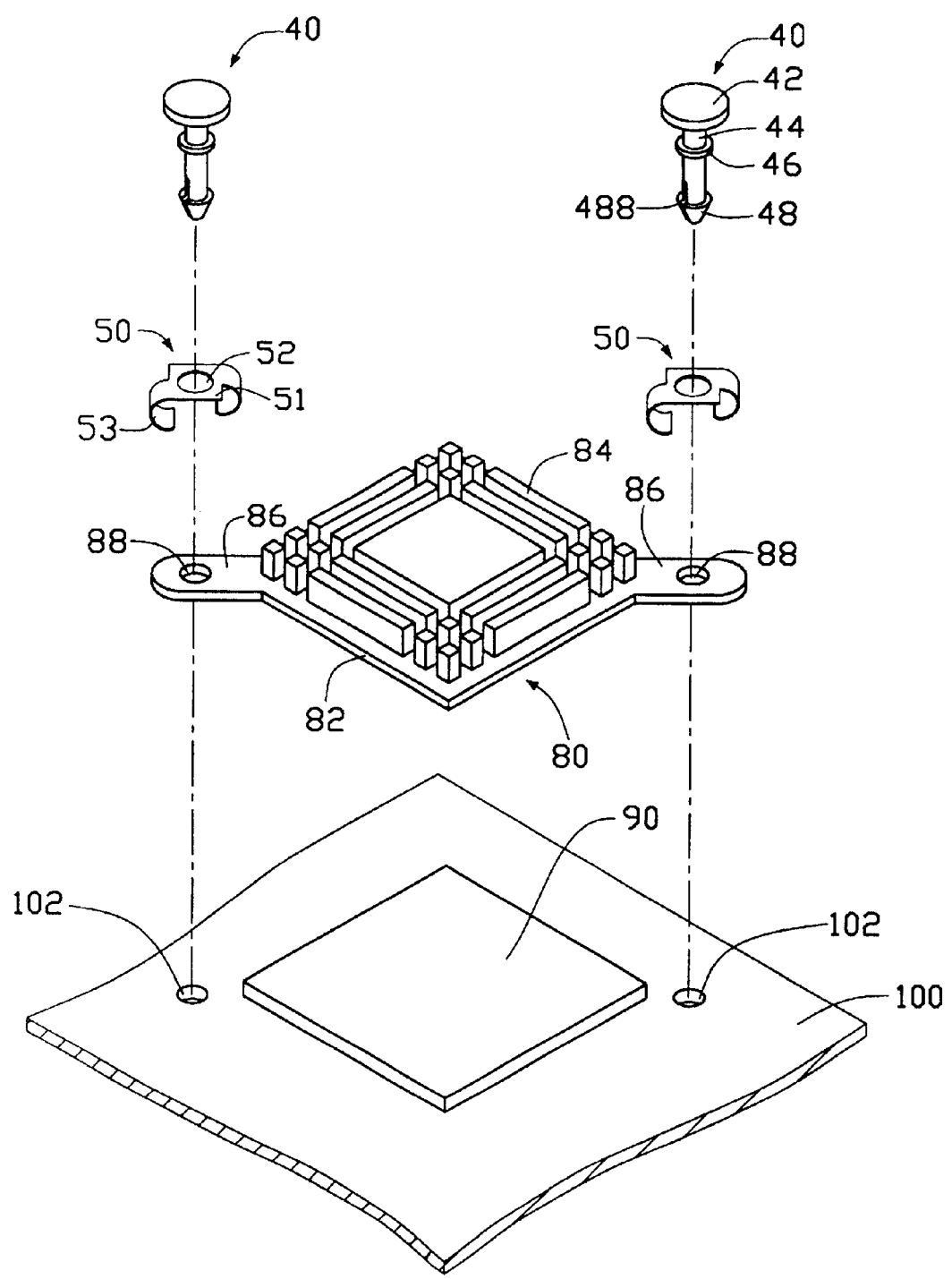
FIG. 1 is an exploded view of a clip in accordance with a preferred embodiment of the present invention, and a heat sink and an electronic device package mounted on a printed circuit board.

Referring to FIG. 1, a clip in accordance with the present invention is used for attaching a heat sink 80 to an electronic device package 90 mounted on a printed circuit board (PCB) 100. The heat sink 80 comprises a rectangular plate 82 and a plurality of fins 84 extending vertically from a top surface of the plate 82. A pair of ears 86 extends respectively from opposite corners of the plate 82, each defining an aperture 88 therein. A pair of fixing holes 102 is defined in the PCB 100 corresponding to the apertures 88 of the heat sink 80.

A preferred embodiment of a clip in accordance with the present invention comprises a pair of pins 40 and a pair of leaf springs 50. Each pin 40 includes a columnar body 44, an expanded head 42 formed at a top end of the body 44, and a cone-shaped plug 48 formed at a bottom end of the body 44. A vertical slot 488 is defined through the plug 48 and a bottom portion of the body 44, to enable the plug 48 to elastically deform. A flange 46, serving as a stop, extends perpendicularly from the body 44 between the head 42 and the plug 48. The leaf spring 50 includes a base 51, with an opening 52 defined therein for extension of the pin 40 therethrough. A pair of inflexed prolongations 53 each extends downwards and inwards in an arc from opposite corners of the base 51. The width of each prolongation 53 is preferably less than half the width of the base 51 from which it extends. This enables the prolongations 53 to be mass produced with minimal generation of scrap, thereby reducing production costs.

Figure 2:
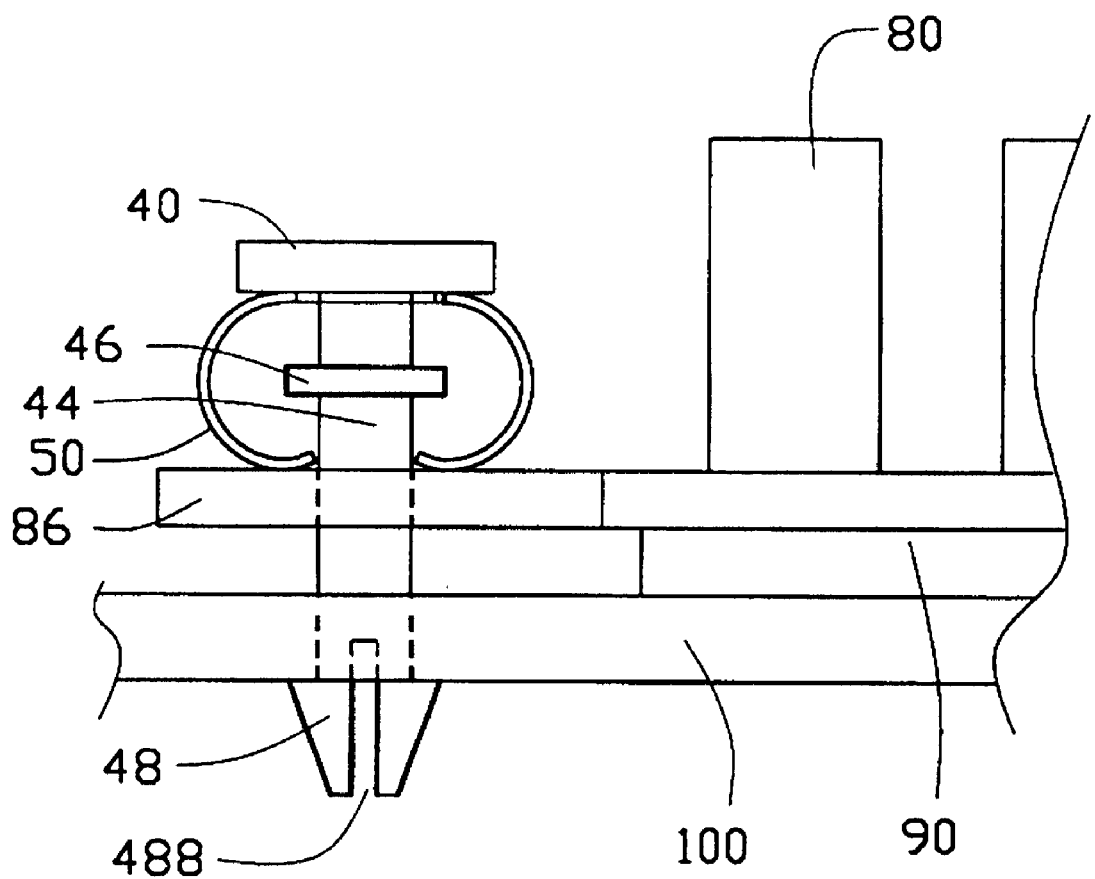
FIG. 2 is an assembled partial side view of FIG. 1.

Also referring to FIG. 2, in assembly, the plug 48 of each pin 40 extends through the opening 52 of the leaf spring 50, the aperture 88 of the heat sink 80 and the hole 102 of the board 100, thereupon engaging with the board 100. The top surface of the base 51 of the leaf spring 50 abuts against the bottom surface of the head 42. The end of the prolongations 53 of each leaf spring 50 abut against the ear 86 of the heat sink 80. Each leaf spring 50 is elastically deformed, thereby firmly fixing the heat sink 80 to the electronic device package 90. The flange 46 of each pin 40 restricts the prolongations 53 of the leaf spring 50 from moving upwards too far along the body 44 of the pin 40, thereby preventing the leaf spring 50 from over distorting.

Figure 3:
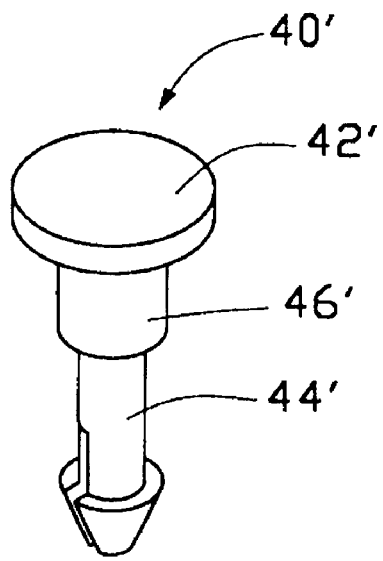
FIG. 3 is a perspective view of a pin in accordance with an alternative embodiment of the present invention.

Referring to FIG. 3, an alternative embodiment of the present invention includes a pair of pins 40'. The flange 46 of each pin 40 of the preferred embodiment (see FIG. 1) is replaced with a shoulder 46'. The shoulder 46' has a diameter substantially greater than that of the body 44', and substantially less than that of the expanded head 42'. The shoulder 46' extends downward from the expanded head 42', and restricts the prolongations 53 of the leaf spring 50 from moving upwards too far along the body 44' of the pin 40', thereby preventing the leaf spring 50 from over distorting.

Figure 4:
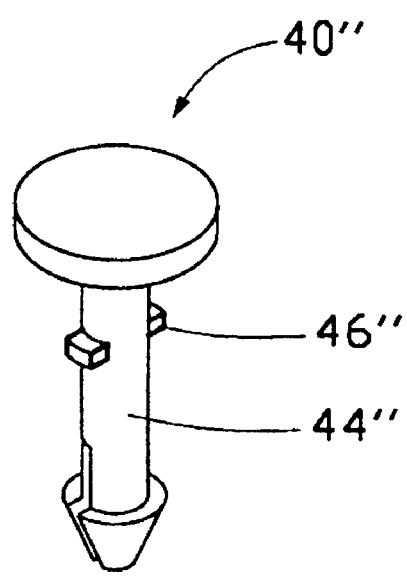
FIG. 4 is a perspective view of a pin in accordance with a further alternative embodiment of the present invention.
Figure 5:
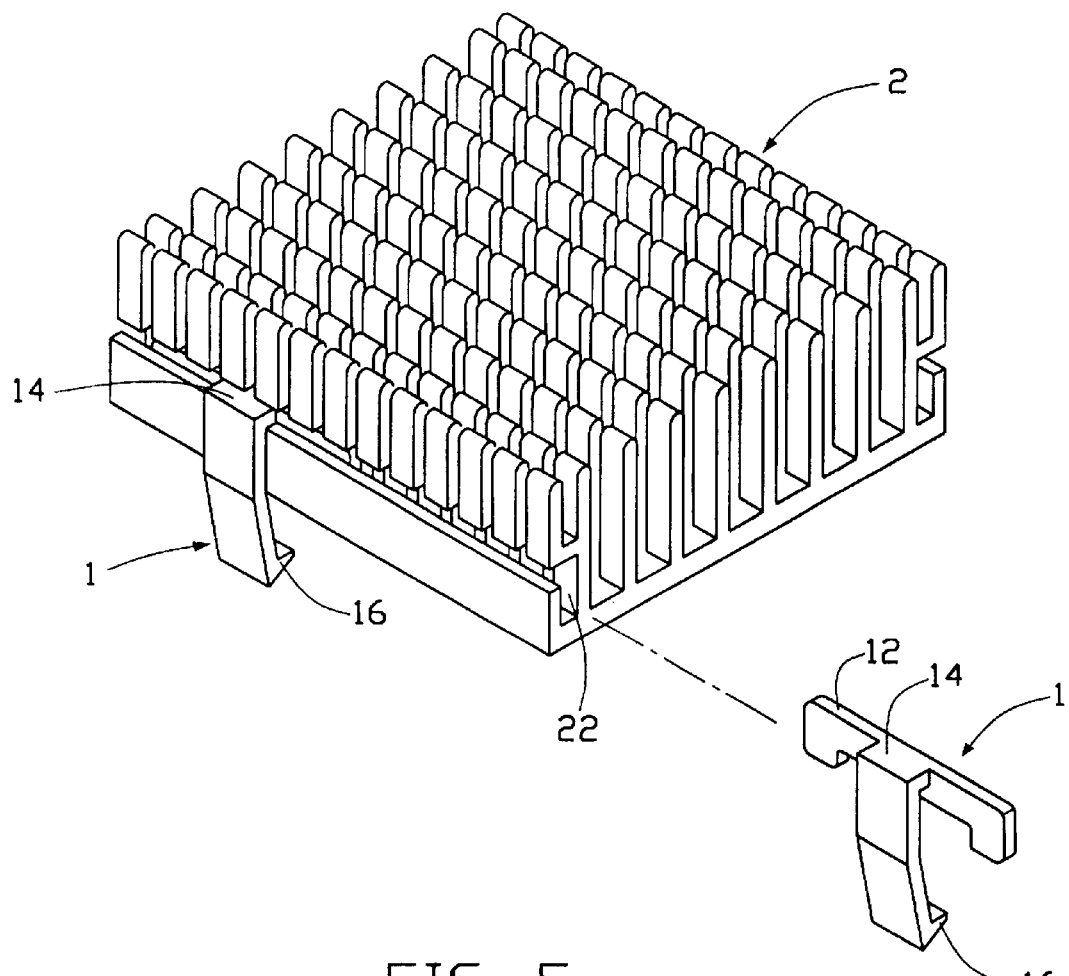
FIG. 5 is a partially exploded view of a conventional clip device and a heat sink.
Figure 6:
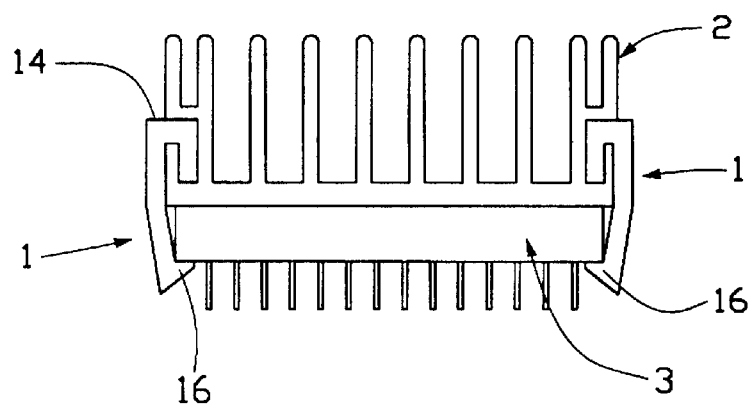
FIG. 6 is an assembled side view of FIG. 5, together with an electronic device package.

Referring to FIG. 4, a further alternative embodiment of the present invention includes a pair of pins 40". The flange 46 of each pin 40 of the preferred embodiment (see FIG. 1) is replaced with a pair of tabs 46" extending perpendicularly from respective opposite sides of the body 44". The tabs 46" restrict the prolongations 53 of the leaf spring 50 from moving upwards too far, thereby preventing the leaf spring 50 from over distorting.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A clip for attaching a heat sink to an electronic device package mounted on a circuit board, comprising:

a pin having a body with an expanded head, a flange and an elastically deformable plug respectively extending therefrom, wherein the flange is between the expanded head and the elastically deformable plug; and at least a leaf spring disposed between the expanded head and the plug of the pin, for elastically deforming and abutting against the expanded head and against the heat sink, thereby securing the heat sink to the electronic device package, and wherein the flange of the pin prevents both distal ends of the leaf spring from moving too far and over deforming the leaf spring.

2. The clip as described in claim 1 wherein the body is columnar in shape, and the expanded head is formed at a top end thereof and the plug is formed at a bottom end thereof opposite the head, the clip being adapted for extension through the heat sink and engagement with the circuit board.

3. The clip as described in claim 2, wherein the plug is cone-shaped and a slot is defined through the plug and a bottom portion of the body, to enable the plug to elastically deform.

4. The clip as described in claim 1, wherein the flange is a shoulder formed to connect with the expanded head as a part of the body for preventing the leaf spring from over distortion.

5. The clip as described in claim 1, wherein the flange is a pair of tabs extending outwards from opposite sides of the body for preventing the leaf spring from over distorting.

6. The clip as described in claim 1, wherein the leaf spring has a base, with an opening defined therein for extension of the pin.

7. The clip as described in claim 6, wherein a pair of inflexed prolongations extends downwards and inwards from opposite corners of the base.

8. The clip as described in claim 7, wherein a width of each prolongation is less than half a width of the base.

9. A heat sink assembly comprising:

a heat sink defining an aperture extending therethrough in a vertical direction;

a printed circuit board defining a fixing hole in alignment with said aperture in said vertical direction;

a pin including a columnar body with an expanded head on a top end thereof and a deflectable plug on a bottom end thereof abutting against a bottom face of the printed circuit board, and a flange serving as a stopper diametrically extending on a middle portion of the body between said head and said plug; and a leaf spring including a base abutting against a bottom face of the head and an inflexed prolongation extending downwardly, curvedly from the base, a free end of said prolongation abutting against a top face of the heat sink; wherein said flange is located between said base and said free end of said prolongation of said leaf spring.

* * * * *